United States Patent [19]

Rostoker et al.

[11] Patent Number: 5,654,563

[45] Date of Patent: Aug. 5, 1997

[54] MICROELECTRONIC INTEGRATED CIRCUIT INCLUDING TRIANGULAR SEMICONDUCTOR "OR" GATE DEVICE

[75] Inventors: Michael D. Rostoker, Boulder Creek; James S. Koford, Mountain View; Ranko Scepanovic, San Jose; Edwin R. Jones, Sunnyvale; Gobi R. Padmanahben, Sunnyvale; Ashok K. Kapoor, Palo Alto, all of Calif.; Valeriy B. Kudryavtsev, Moscow, U.S.S.R.; Alexander E. Andreev, Moskovskata Oblast, U.S.S.R.; Stanislav V. Aleshin; Alexander S. Podkolzin, both of Moscow, U.S.S.R.

[73] Assignee: LSI Logic Corporation, Milpitas, Calif.

[21] Appl. No.: 567,894

[22] Filed: Dec. 6, 1995

Related U.S. Application Data

[63] Continuation of Ser. No. 438,605, May 10, 1995, abandoned.

[51] Int. Cl.$^6$ ........................ H01L 25/00; H01L 29/772
[52] U.S. Cl. ........................ 257/206; 257/379; 257/390; 257/401
[58] Field of Search ........................ 257/368, 379, 257/391, 393, 390, 401, 202, 206

[56] References Cited

U.S. PATENT DOCUMENTS 5,331,192  7/1994  Kudoh ........................ 257/401
5,479,034  12/1995  Hashimoto et al. ........................ 257/401

FOREIGN PATENT DOCUMENTS 0016174  1/1991  Japan ........................ 257/401

*Primary Examiner*—Peter Toby Brown
*Attorney, Agent, or Firm*—Oppenheimer Poms Smith

[57] ABSTRACT

A microelectronic integrated circuit includes a semiconductor substrate, and a plurality of microelectronic devices formed on the substrate. Each device has a periphery defined by a triangle, and includes an active area formed within the periphery, a central terminal formed in a central portion of the active area, and interconnected first to third terminals formed in the active area adjacent to vertices of the triangle respectively. First to third gates are formed between the first to third terminals respectively and the central terminal, and have contacts formed outside the active area adjacent to the sides of the triangle. The power supply connections to the central terminal and the first to third terminals, the conductivity type (NMOS or PMOS), and the addition of a pull-up or a pull-down resistor is selected for each device to provide a desired OR, NOR, AND or NAND function. One or two of the first to third terminals, rather than the central terminal, can be used for output to provide an AND/OR logic function. The devices are interconnected using three direction routing based on hexagonal geometry.

39 Claims, 7 Drawing Sheets

OUT = A (B+C)

MICROELECTRONIC INTEGRATED CIRCUIT INCLUDING TRIANGULAR SEMICONDUCTOR "OR" GATE DEVICE

CROSS-REFERENCE TO RELATED APPLICATION

This application is a continuation of U.S. patent application Ser. No. 08/438,605, filed May 10, 1995, now abandoned.

BACKGROUND OF THE INVENTION

1. Field of the Invention

The present invention generally relates to the art of microelectronic integrated circuits, and more specifically to a microelectronic integrated circuit including a plurality of triangular semiconductor "OR" gate devices which can be interconnected using three direction routing based on hexagonal geometry.

2. Description of the Related Art

Microelectronic integrated circuits consist of large numbers of semiconductor devices that are fabricated by layering several different materials on a silicon base or wafer. These devices include logic gates that provide AND, OR, NAND, NOR and other binary logic functions. Each device includes a plurality of pins or terminals that are connected to pins of other devices by electrical interconnect wire networks or nets.

As illustrated in FIG. 1, a conventional microelectronic integrated circuit 10 comprises a substrate 12 on which a large number of semiconductor devices are formed. These devices include large functional macroblocks such as indicated at 14 which may be central processing units, input-output devices or the like. A typical integrated circuit further comprises a large number of smaller devices such as logic gates 16 which are arranged in a generally rectangular pattern in the areas of the substrate 12 that are not occupied by macroblocks.

The logic gates 16 have terminals 18 to provide interconnections to other gates 16 on the substrate 12. Interconnections are made via vertical electrical conductors 20 and horizontal electrical conductors 22 that extend between the terminals 18 of the gates 16 in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic devices of an integrated circuit extend in three directions that are angularly displaced from each other by 60°.

The conductors pass through points defined by centers of closely packed small hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

A microelectronic integrated circuit that utilizes the present three direction routing arrangement includes a semiconductor substrate, and a plurality of microelectronic devices that are formed on the substrate in a closely packed triangular arrangement that maximizes the space utilization of the circuit.

Each device has a periphery defined by a large triangle, and includes an active area formed within the periphery, a central terminal formed in a central portion of the active area, and interconnected first to third terminals formed in the active area adjacent to vertices of the triangle.

First to third gates are formed between the first to third terminals respectively and the central terminal, and have contacts formed outside the active area adjacent to the edges of the triangle. The central and first to third terminals, and the gates are connected using the three direction hexagonal routing arrangement.

The power supply connections to the central terminal and the first to third terminals, the conductivity type (NMOS or PMOS), and the addition of a pull-up or a pull-down resistor is selected for each device to provide a desired OR, NOR, AND or NAND function. One or two of the first to third terminals, rather than the central terminal, can be used for output to provide an AND/OR logic function.

The present invention substantially reduces the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
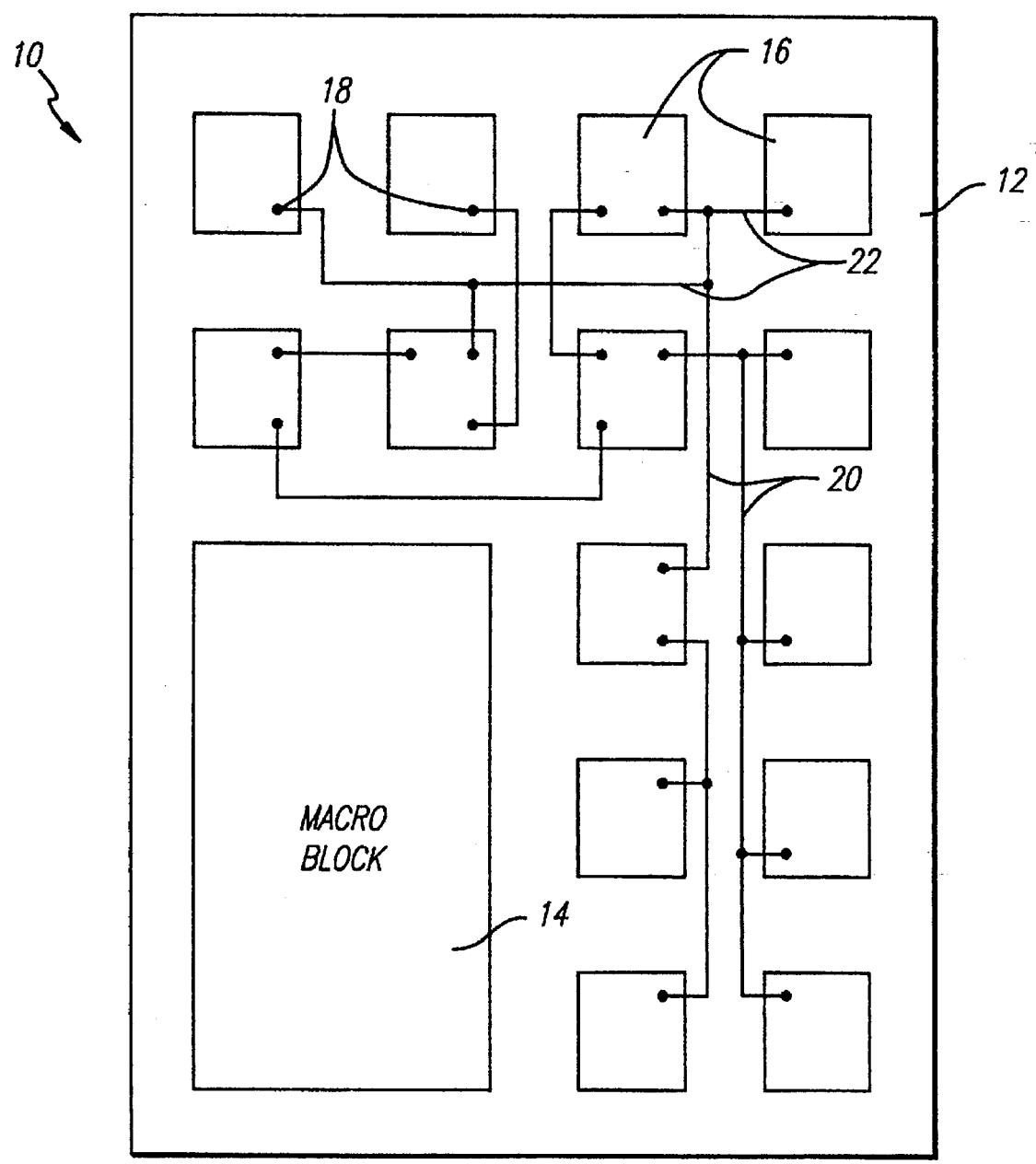
FIG. 1 is a diagram illustrating a prior art integrated circuit.
Figure 2:
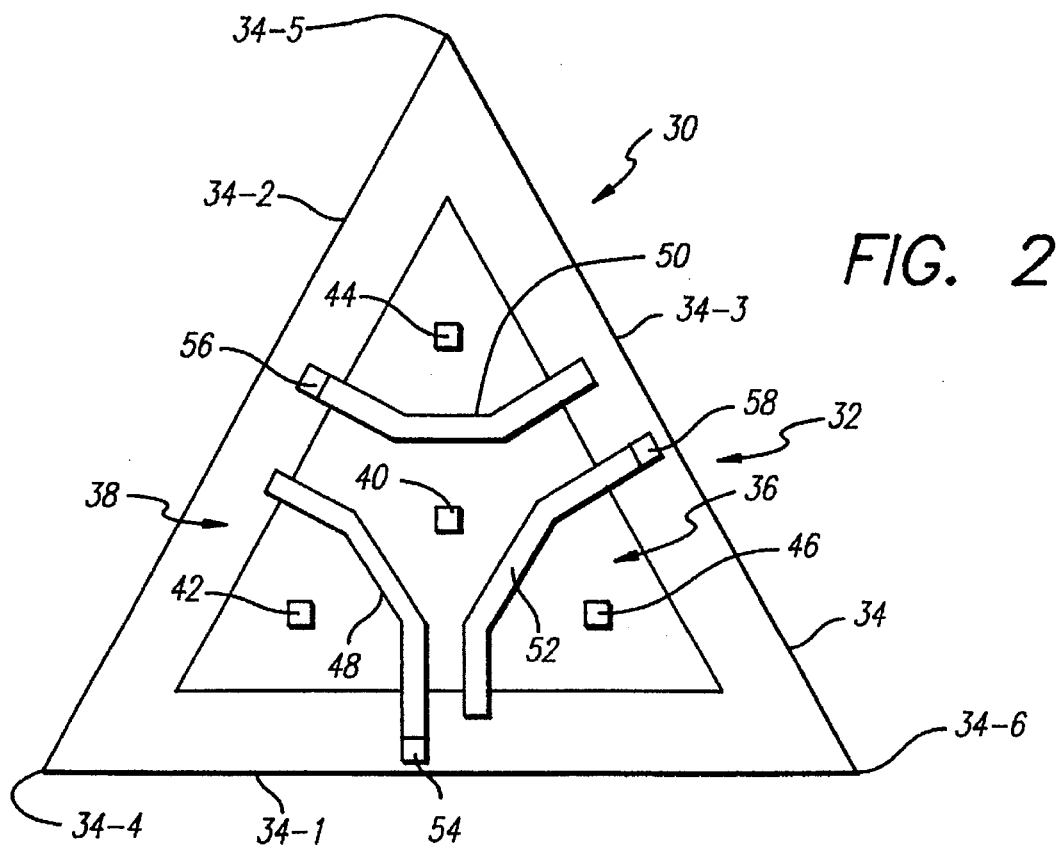
FIG. 2 is a diagram illustrating a microelectronic gate device embodying the present invention.

A semiconductor gate device for a microelectronic integrated circuit is designated by the reference numeral 30 and illustrated in FIG. 2. The device 30, in its basic form, provides a logical OR function, but can be adapted to provide a logical NOR, AND, NAND or other logical function as will be described below.

The gate device 30 is formed on a substrate 32, and has a triangular periphery 34 including first to third edges 34-1, 34-2 and 34-3, and first to third vertices 34-4, 34-5 and 34-6 respectively in the illustrated arrangement. A triangular semiconductor active area 36 is formed within the periphery 34, and an inactive area 38 is defined between the active area 36 and the periphery 34.

The device 30 comprises a central electrically conductive electrode or terminal 40 which functions as a Field-Effect-Transistor (FET) source terminal, and first, second and third electrodes or terminals 42, 44 and 46 respectively that are formed in the active area 36 adjacent to the first, second and third vertices 34-4, 34-5 and 34-6 respectively.

The terminals 42, 44 and 46 function as FET drain terminals, and are preferably interconnected for operation. Although one each of the terminals 42, 44 and 46 is illustrated in the drawing, it is within the scope of the invention to provide two or more each of the terminals 42, 44 and 46.

The device 30 further comprises first, second and third gates 48, 50 and 52 that are formed between the first, second and third terminals 42, 44 and 46 respectively and the central terminal 40. The gates 48, 50 and 52 are preferably insulated gates, each including a layer of insulating oxide with a layer of conductive material (metal or doped polysilicon) formed over the oxide in a Metal-Oxide-Semiconductor (MOS) configuration. First to third gate electrodes or terminals 54, 56 and 58 are formed in the inactive area 38 adjacent to the triangular edges 34-1, 34-2 and 34-3, and are electrically connected to the gates 48, 50 and 52 respectively. It will be noted that the locations of the gate terminals 54, 56 and 58 are exemplary, and that the gate terminals can be located at different points in the device in accordance with the requirements of a particular design or application.

In order to provide effective source-drain electrical isolation, the opposite end portions of each of the gates 48, 50 and 52 extend into the inactive area 38.

The device 30 in its most basic form provides a logical OR function. Each drain terminal 42, 44 and 46 and respective gate 48, 50 and 52 forms a field effect transistor in combination with the common source terminal 40 such that each transistor can independently establish a conduction channel between its drain and the source. This is an "any" or "OR" configuration.

Figure 3:
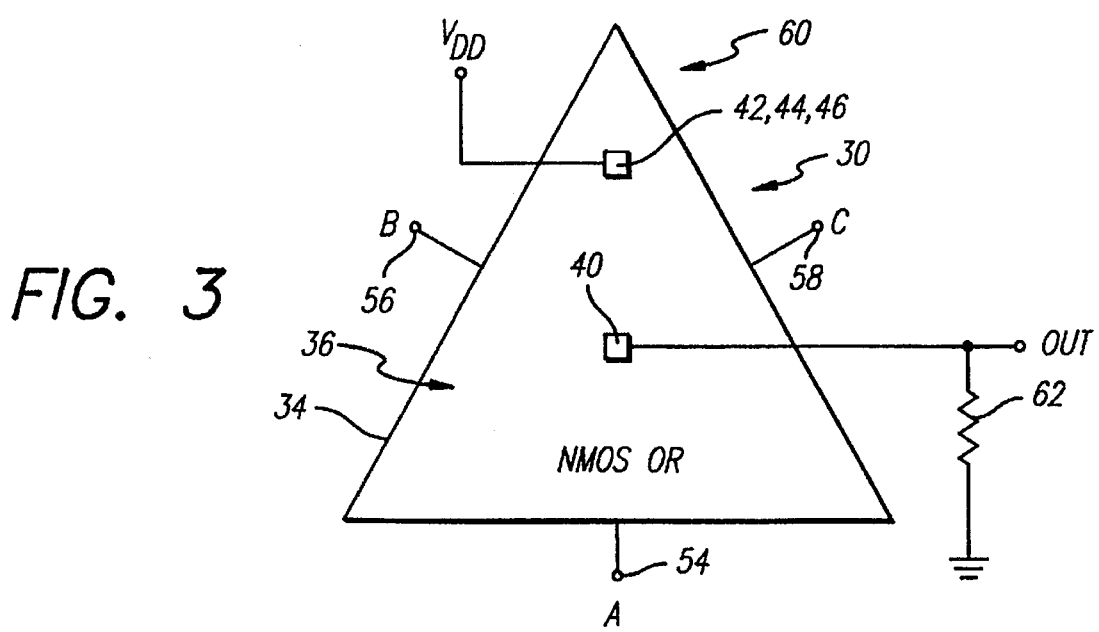
FIG. 3 is an electrical schematic diagram illustrating the present device connected to provide a logical OR function.

An OR gate 60 based on the device 30 is illustrated in FIG. 3. The device 30 is shown in simplified form for clarity of illustration, with only the triangular periphery 34 and terminals 40, 44, 54, 56 and 58 included in the drawing. The terminals 42 and 46 are not explicitly illustrated, and are assumed to be electrically connected to the terminal 44. Input signals A, B and C are applied to the gate terminals 54, 56 and 58 respectively, and an output signal OUT is taken at the central or source terminal 40.

In the OR gate 60 of FIG. 3, the active area 36 of the device 30 is P-type to provide NMOS FET operation. The terminals 42, 44 and 46 are connected to an electrical potential $V_{DD}$ which is more positive than ground. The terminal 40 is connected to ground through a pull-down resistor 62.

A logically high signal will be assumed to be substantially equal to $V_{DD}$, and a logically low signal will be assumed to be substantially equal to ground. With all logically low input signals A, B and C applied to the gate terminals 54, 56 and 58 respectively, the device 30 will be turned off and the resistor 62 will pull the output low (to ground).

Since the device 30 provides NMOS operation in the configuration of FIG. 3, a positive input to any of the gate terminals 54, 56 and 58 will establish a conductive channel between the terminals 42, 44 and 46 respectively and the central terminal 40. Any one of these channels will connect the central terminal 40 to the potential $V_{DD}$ to produce a logically high output. In this manner, the OR gate 60 produces a logically high output when any or all of the inputs is high.

Figure 4:
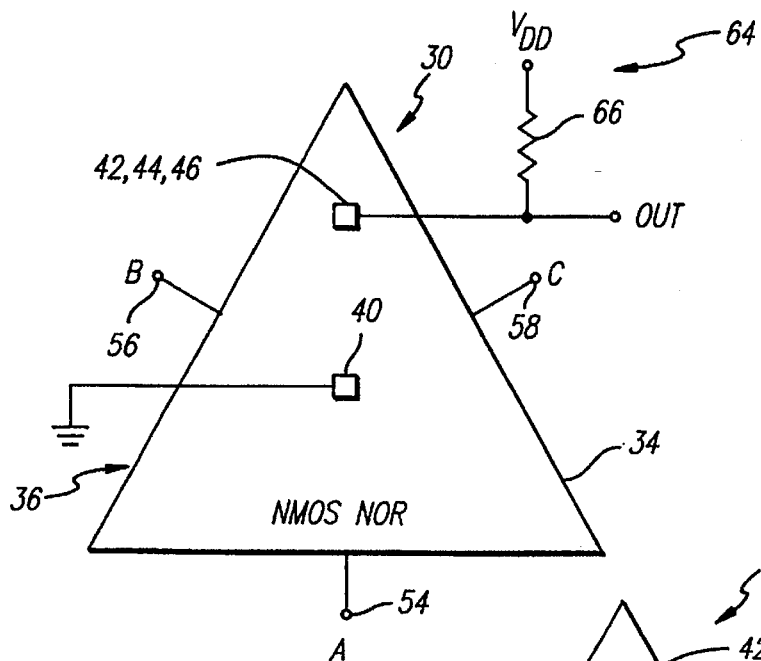
FIG. 4 is an electrical schematic diagram illustrating the gate device connected to provide a logical NOR function.

FIG. 4 illustrates the device 30 connected in circuit to function as a NOR gate 64. In this case also, the active area 36 of the device 30 is P-type to provide NMOS operation. The central terminal 40 is connected to ground, and the terminals 42, 44 and 46 are connected to $V_{DD}$ through a pull-up resistor 66. The output signal OUT appears at the terminals 42, 44 and 46.

When all of the inputs are low, the device 30 is turned off and the output will be pulled to $V_{DD}$ by the pull-up resistor 66 to produce a logically high output. If any of the inputs is high, a conductive channel will be established between the respective terminals 42, 44 and 46 and the central terminal 40 to connect the terminals 42, 44 and 46 and thereby the output to ground to produce a logically low output. In this manner, the output signal OUT will be high if all inputs are low, and low if any or all inputs are high to produce the NOR function.

Figure 5:
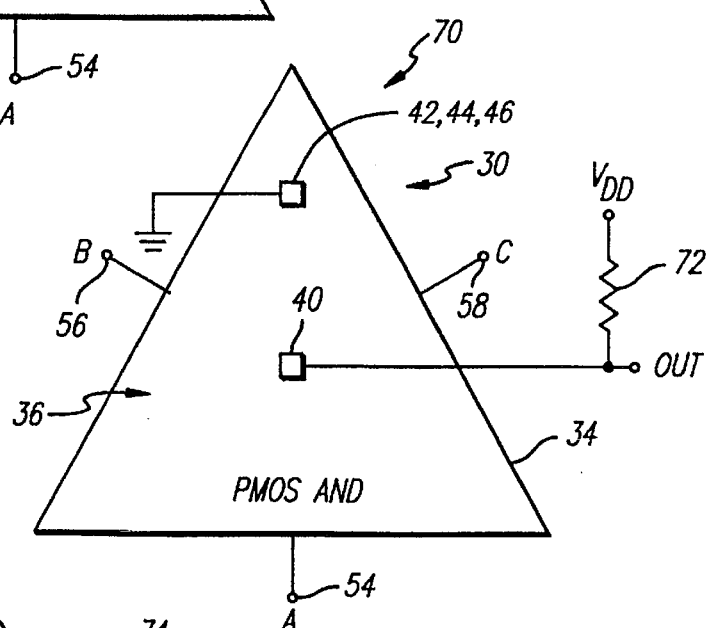
FIG. 5 is an electrical schematic diagram illustrating the gate device connected to provide a logical AND function.

An AND gate 70 incorporating the device 30 is illustrated in FIG. 5. In the AND gate configuration, the active area 36 is N-type to provide PMOS FET operation, and the terminals 42, 44 and 46 are connected to ground. The central terminal 40 is connected to $V_{DD}$ through a pull-up resistor 72, and the output is taken at the terminal 40.

Due to the PMOS configuration of the device 30 in the AND gate 70, a logically low input signal IN A, IN B or IN C will establish a conductive channel between the terminals 42, 44 and 46 respectively and the central terminal 40. This connects the output to ground. Thus, any low input will produce a low output.

When all of the inputs are high, the device 30 is turned off, and the output is pulled high by the pull-up resistor 72. Thus, the desired AND function is provided.

Figure 6:
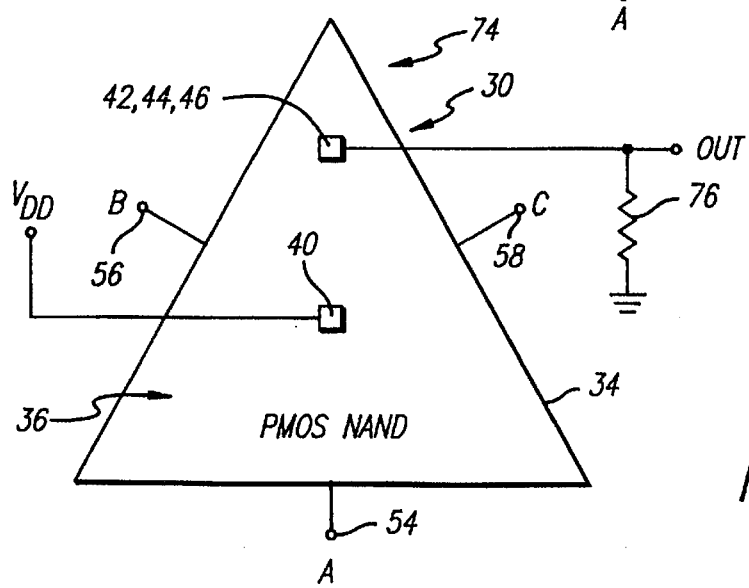
FIG. 6 is an electrical schematic diagram illustrating the gate device connected to provide a logical NAND function.

A NAND gate 74 incorporating the device 30 is illustrated in FIG. 6, in which the active area 36 is N-type to provide PMOS operation. The central terminal 40 is connected to $V_{DD}$, whereas the terminals 42, 44 and 46 are connected to ground through a pull-down resistor 76. The output is taken at the terminals 42, 44 and 46.

Any low input will establish a conductive channel between the terminals 42, 44 and 46 and the central terminal 40, thereby connecting the output to $V_{DD}$ and producing a high output. When all of the inputs are high, the device 30 is turned off and the output is pulled to ground by the resistor 76. Thus, the NAND configuration is provided, in which any low input produces a high output, and the output is low in response to all inputs being high.

The device 30 is illustrated as having three inputs, which is ideally suited to the triangular device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the OR gate 60 of FIG. 3 with only two inputs, the gate terminal 58 can be grounded and the two inputs applied to the gate terminals 54 and 56. The AND gate 70 of FIG. 5 can be adapted to provide a two input configuration by connecting the gate terminal 58 to $V_{DD}$ and applying the two inputs to the gate terminals 54 and 56.

It is also within the scope of the invention to modify the device 30 to have only one or two inputs by physically omitting one or two of the gates 48, 50 and 52 and respective terminals 42,44,46 and 54,56,58.

Figure 7:
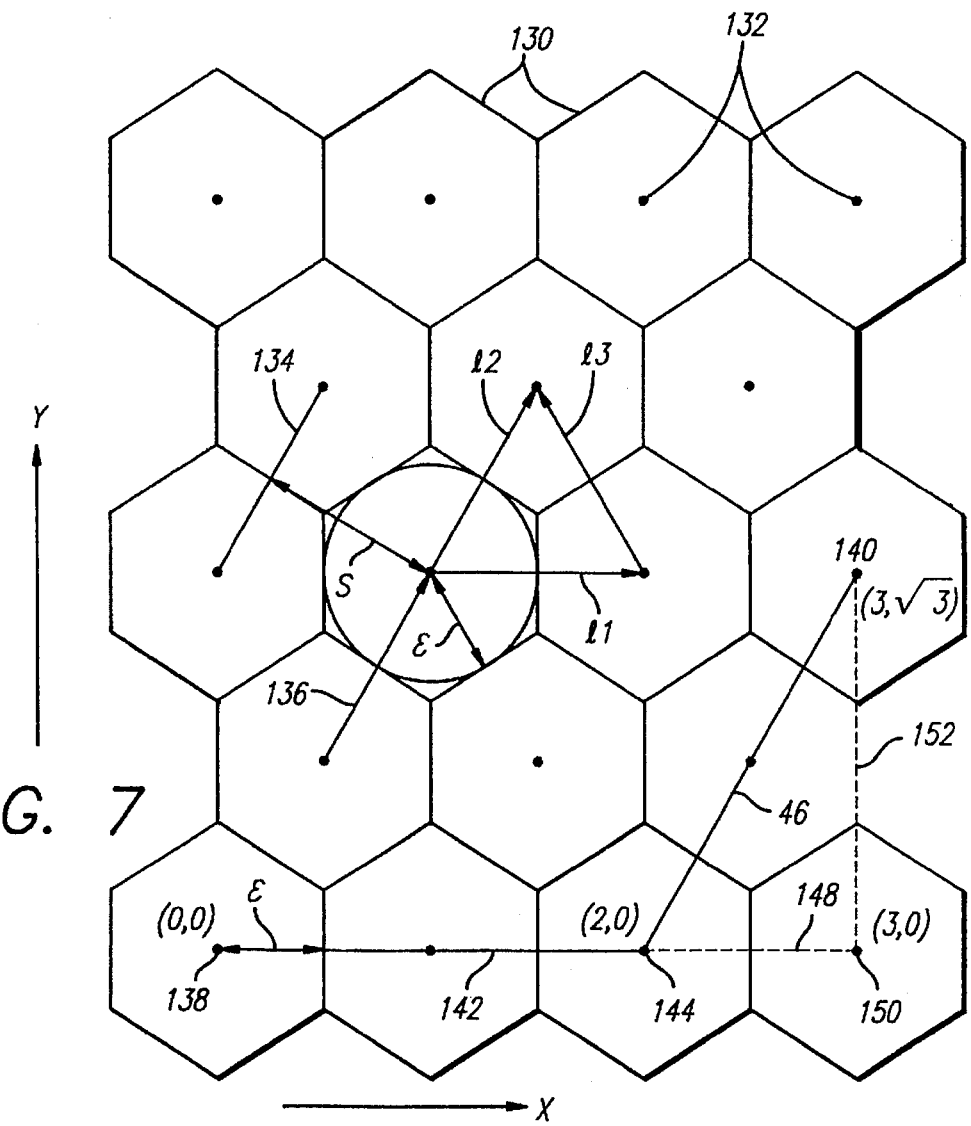
FIG. 7 is a diagram illustrating three direction routing for interconnecting the present devices based on hexagonal geometry in accordance with the present invention.

The geometry of a three directional hexagonal routing arrangement for interconnecting logic gates based on the present device 30 is illustrated in FIG. 7. An orthogonal coordinate system has an X axis and a Y axis. A closely packed pattern of small hexagons 130 is superimposed on the coordinate system, with the centers of the hexagons 130 being designated as terminal points 132.

For the purpose of the present disclosure, the term "closely packed" is construed to mean that the hexagons 130 are formed in a contiguous arrangement with adjacent hexagons 130 sharing common sides as illustrated, with no spaces being provided between adjacent hexagons 130. As will be described in detail below, logic gate devices based on the present device 30 are formed on the substrate 32 in a closely packed arrangement, each logic gate device covering a number of the small hexagons 130.

In accordance with the invention, the centers of the hexagons 130 as indicated at 132 represent interconnect points for terminals of the logic gate devices. Electrical conductors for interconnecting the points 132 extend in three directions that make angles of 60° relative to each other.

The conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 7, they form an equilateral triangle. For convenience, the notation $e_1$, $e_2$ and $e_3$ is used to denote the vectors that extend in the respective routing directions as well as the directions themselves. The radius of the circles that are inscribed by the hexagons 130 is designated as $\epsilon$.

The vectors $e_1$, $e_2$ and $e_3$ can be defined using the following notation.

$$e_1 = (1,0), e_2 = [(1/2),(\sqrt{3}/2)], e_3 = -e_1 - e_2.$$

The geometric structure of the present invention can also be defined using set theory. A set SIX($\alpha,\epsilon$) of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set SIX($\alpha$, ½) for all $\alpha$ from the set SU intersect only on the edges of the hexagons and partition the plane into the closely packed arrangement as illustrated. Circles inscribed in these hexagons are also densely packed.

As further illustrated in FIG. 7, the perpendicular distance S between two adjacent conductors extending in the direction $e_2$, such as conductors 134 and 136, is equal to S= $\sqrt{3}/2$=0.87 measured in X-Y coordinates, or S=$\sqrt{3}\epsilon$=1.73$\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 7, terminal points 138 and 140 to be interconnected are located at (x,y) coordinates (0,0) and (3,$\sqrt{3}$) respectively.

Using the present routing arrangement, the points 138 and 140 can be connected by a first conductor 142 extending in the direction $e_1$ from the point 138 to a point 144 at coordinates (2,0), and a second conductor 146 extending from the point 144 in the direction $e_2$ to the point 140. The length of each of the conductors 142 and 146 is 2, and the total connection length is 4.

Using the conventional rectilinear routing method, connection between the points 138 and 140 also requires the conductor 142 from the point 138 to the point 144. However, rather than the diagonal conductor 146, the conventional method requires two conductors, a conductor 148 from the point 144 to a point 150 at coordinates (3,0), and a conductor 152 from the point 150 to the point 140.

The combined length of the conductors 142 and 148 is 3, whereas the length of the conductor 152 is $\sqrt{3}$. The total length of the conventional rectilinear interconnect path is therefore 3+$\sqrt{3}$=4.73. The conventional path length between the points 138 and 140 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 8:
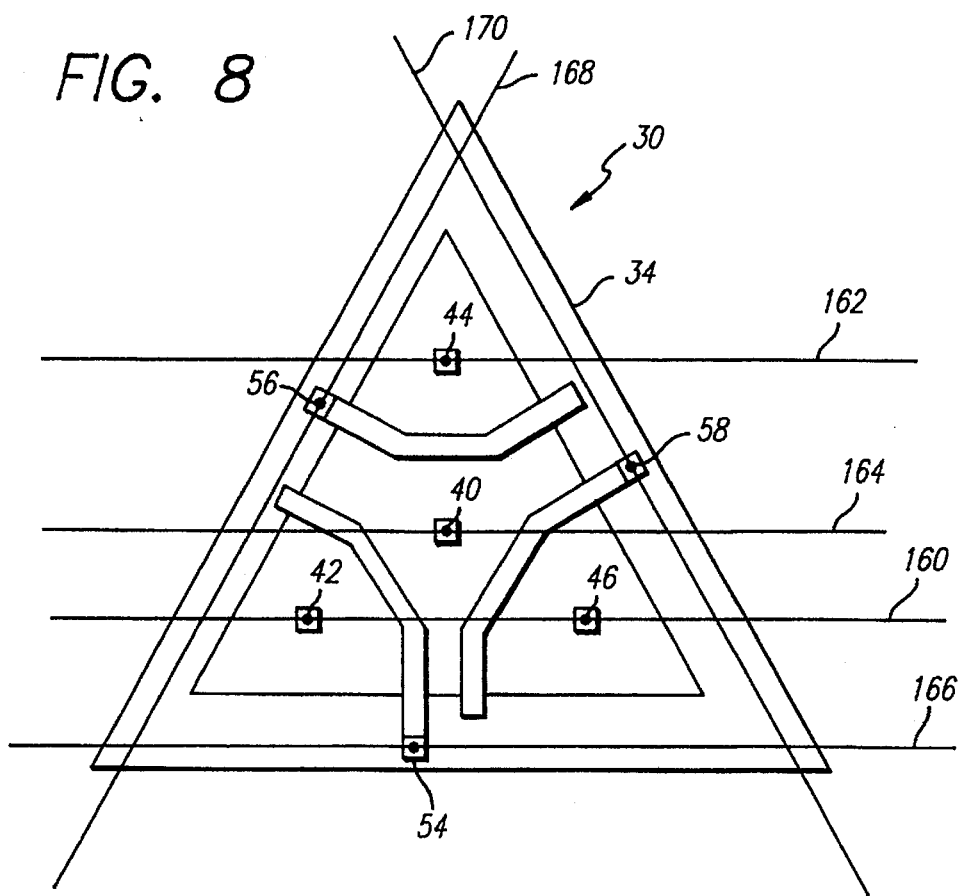
FIG. 8 is a diagram illustrating one device as connected using the three direction routing of FIG. 7.

An example of the device 30 as being interconnected using the hexagonal routing arrangement of FIG. 7 is illustrated in FIG. 8. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, a conductor 160 which extends in the direction $e_1$ is provided for interconnecting the terminals 42 and 46. Conductors 162 and 164 which also extend in the direction $e_1$ are provided for interconnection of the central terminals 44 and 40 respectively.

A conductor 166 which extends in the direction $e_1$ is provided for interconnection of the gate terminal 54 for the input A. A conductor 168 which extends in the direction $e_2$ provides interconnection of the gate terminal 56 for the input B, whereas a conductor 170 which extends in the direction $e_3$ provides interconnection of the gate terminal 58 for the input C.

The conductors 166, 168 and 170 are preferably provided in three separate wiring layers respectively. The conductors 160, 162 and 164 are preferably provided in another wiring layer or conductive plane.

The invention is not limited to the particular arrangement of conductors illustrated in FIG. 8. For example, the conductors 160, 162 and 164 can also extend in three directions which are rotated by 60° relative to each other. In such an arrangement, the conductor 160 can extend in the direction $e_1$ together with the conductor 166, the conductor 162 can extend in the direction $e_2$ together with the conductor 168, and the conductor 164 can extend in the direction $e_3$ together with the conductor 170.

Figure 9:
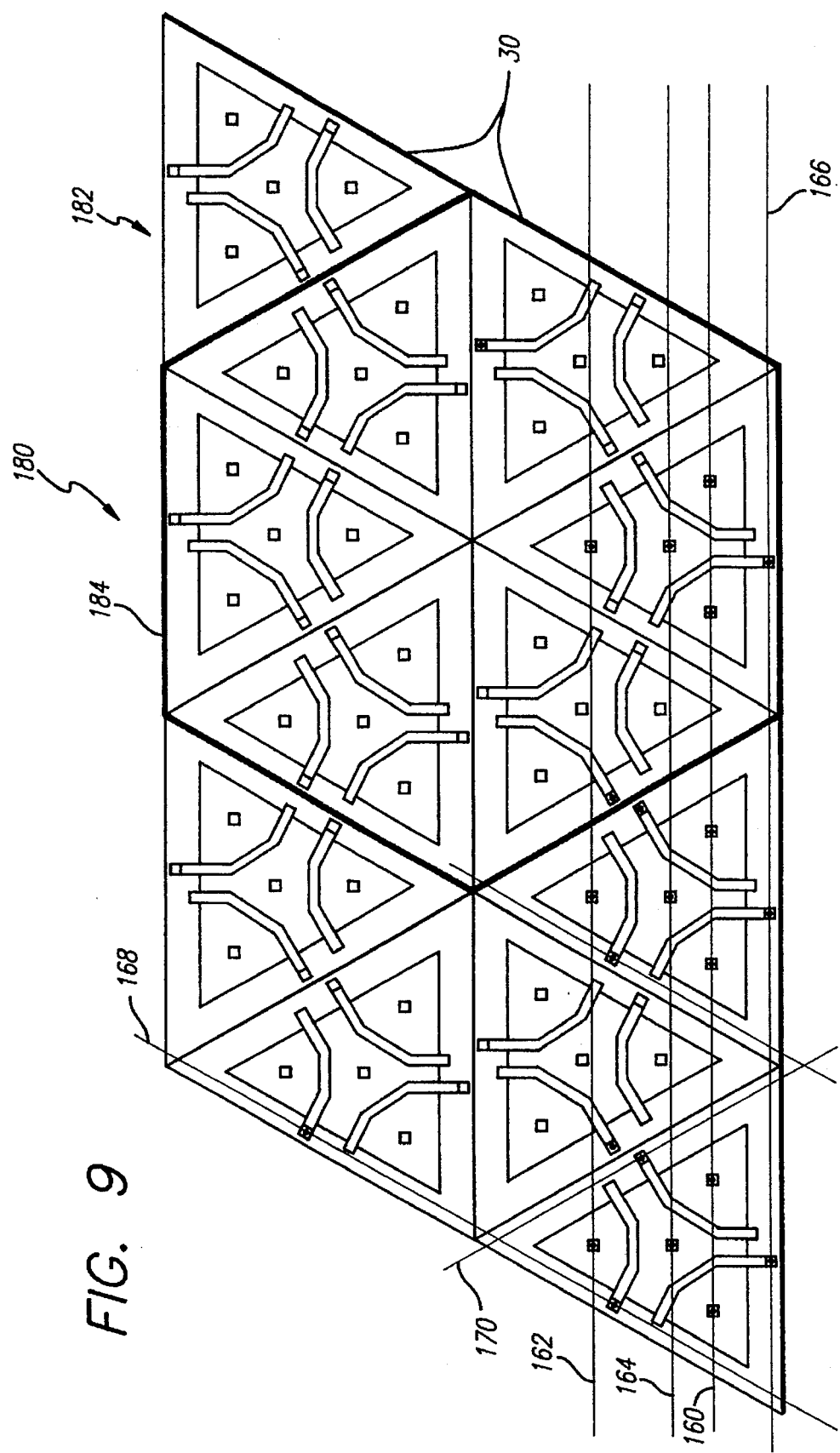
FIG. 9 is a diagram illustrating a microelectronic integrated circuit including a plurality of the present gate devices in a closely packed triangular arrangement.

FIG. 9 illustrates a microelectronic integrated circuit 180 according to the present invention comprising a semiconductor substrate 182 on which a plurality of the devices 30 are formed in a closely packed triangular arrangement. Further sown are a few illustrative examples of interconnection of the devices using the conductors 160, 162, 164, 166, 168 and 170 which extend in the three directions $e_1$, $e_2$ and $e_3$.

It will be noted that six closely packed devices 30 define a hexagonal shape having a periphery 184. This relationship can be used within the scope of the invention to provide unit cells having hexagonal shapes defined by closely packed triangles, with internal structures similar to or different from that those which are explicitly described and illustrated. In such an arrangement, the hexagon can be considered to be the basic building block.

It will be understood from the above description that the present gate device geometry and three direction interconnect arrangement substantially reduce the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

Various modifications will become possible for those skilled in the art after receiving the teachings of the present disclosure without departing from the scope thereof.

For example, it will be understood that the terms "source" and "drain" as applied to field effect transistors merely define opposite ends of a channel region which is controlled by a voltage applied to a gate. The source and drain are interchangeable in that current may flow into either one and out of the other.

Therefore, the terms "source" and "drain", and the relative polarities of voltages applied thereto, as used in the present specification, are arbitrary and reversible within the scope of the invention, and are not to be considered as limiting the invention to one or the other of the possible configurations of polarities.

Figure 10:
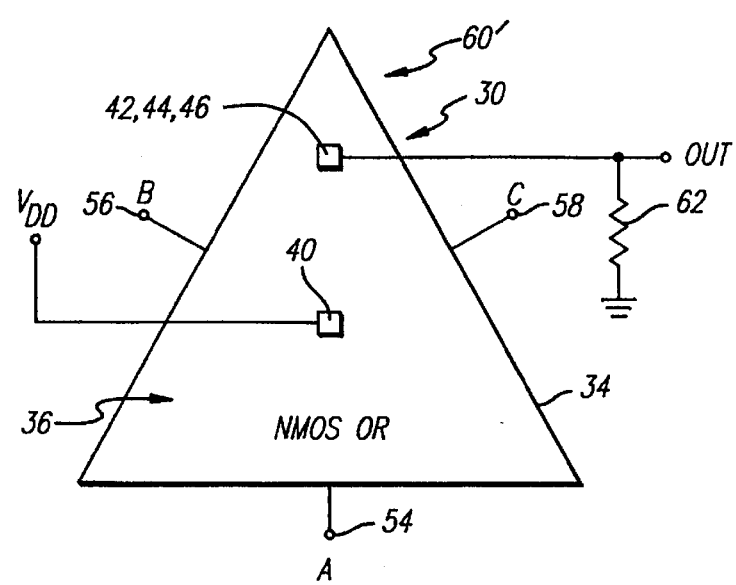
FIG. 10 is a diagram illustrating the gate device connected to provide a logical OR function with source and drain connections reversed.

For example, FIG. 10 illustrates a modified OR gate 60' based on the device 30 which differs from the OR gate 60 of FIG. 3 in that the source and drain terminals of the device 30 are reversed relative to each other.

In this embodiment of the invention, the terminals 42, 44 and 46 constitute sources and are connected to provide the output across the pull-down resistor 62, whereas the center terminal 40 constitutes the drain and is connected to $V_{DD}$.

The operation of the OR gate 60' is otherwise similar to that of the OR gate 60. Although not explicitly illustrated, this modification is equally applicable to all other embodiments of the invention.

Figure 11:
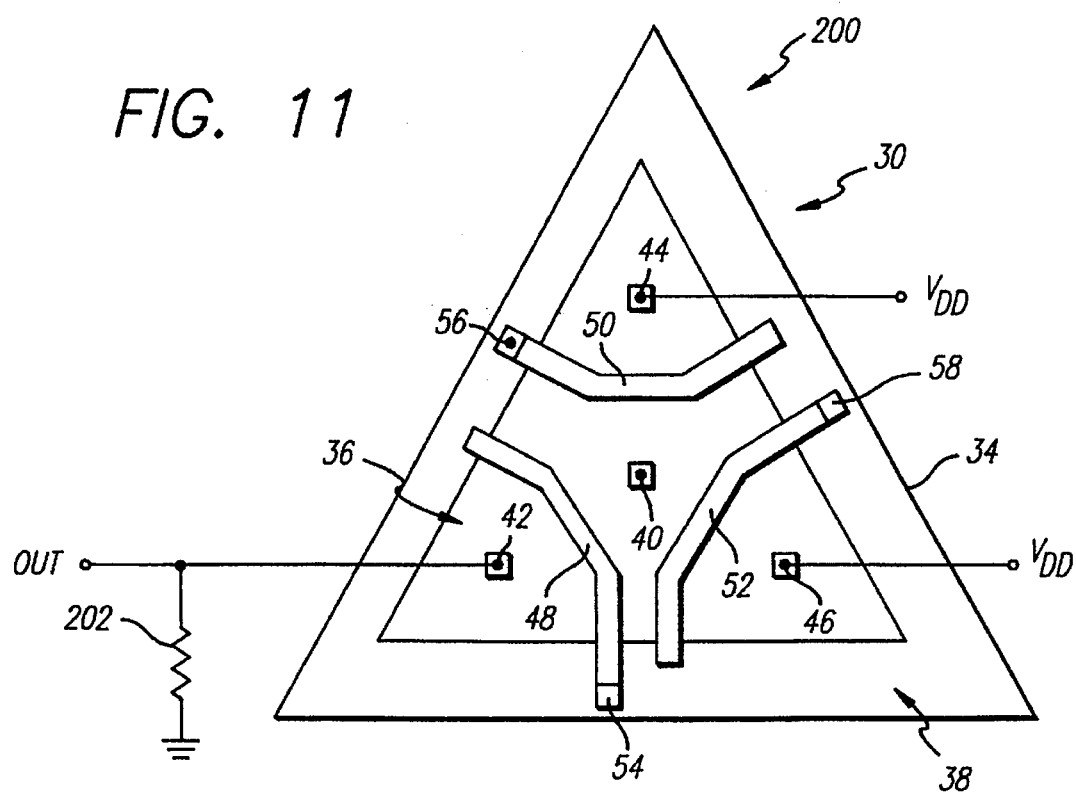
FIG. 11 is a diagram illustrating the gate device connected to provide a logical AND/OR function.
Figure 12:
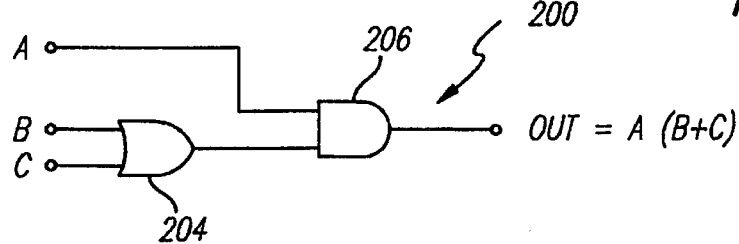
FIG. 12 is a schematic diagram illustrating the logical functionality of the device connected as shown in FIG. 11.
Figure 13:
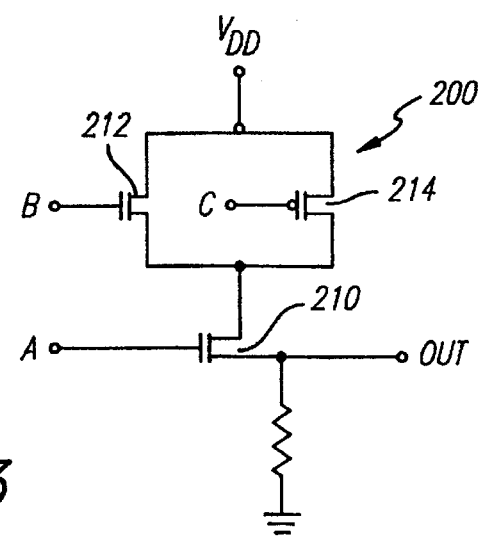
FIG. 13 is a schematic diagram illustrating how individual field effect transistors of the device are connected as shown in FIG. 11.

FIGS. 11 to 13 illustrate how the connections of the device 30 can be changed to provide a different logical function. In an AND/OR gate 200, the central terminal 40 of the device 30 is not used, and can be physically omitted if desired.

In the gate 200, the second and third terminals 44 and 46 are connected to $V_{DD}$, and the output signal OUT appears at the first terminal 42 which is connected to ground through a pull-down resistor 202.

The gate 200 provides the logical function A(B+C). As illustrated in the equivalent circuit diagram of FIG. 12, the inputs B and C are applied to inputs of an OR gate 204, the output of which is applied to an input of an AND gate 206. The input A is applied to another input of the AND gate 206, whereby the output of the AND gate 206 is A(B+C).

Since the first gate 48 is disposed in front of the first terminal 42 which provides the output OUT, a high input must be applied to the first gate terminal 54 to enhance the channel under the gate 48 to allow current to flow to the first terminal 42 from any other part of the device 30. This provides the function of the AND gate 206 of FIG. 12.

Since both the second and third terminals 44 and 46 are connected to $V_{DD}$, enhancement of either of the channels under the second and third gates 50 and 52 will establish a conductive path between $V_{DD}$ and the first gate 48. Thus, a logically high signal applied to either of the second and third gate terminals 56 and 58 will connect $V_{DD}$ to the gate 48. This provides the function of the OR gate 204 of FIG. 12.

In this manner, the output of the gate 200 will be logically high if the input A and either of the inputs B or C is logically high, and the output of the gate 200 will be logically low if the input A is low and/or if both of the inputs B and C are low.

The gate 200 is illustrated in the form of equivalent FET transistors in FIG. 13. The functionality of an FET 210 is provided by the first terminal 42 and the first gate 48 as shown in FIG. 11. The functionality of an FET 212 is provided by the second terminal 44 and second gate 50, whereas the functionality of an FET 214 is provided by the third terminal 46 and third gate 52.

Similar operation can be obtained by using the second terminal 44 or the third terminal 46 as the output terminal, and connecting the other terminals to $V_{DD}$. The principle is that by connecting one of the terminals to the output, the respective gate can block current flow from both of the other terminals, whereas the other two gates can block current flow only from their own respective terminals.

Figure 14:
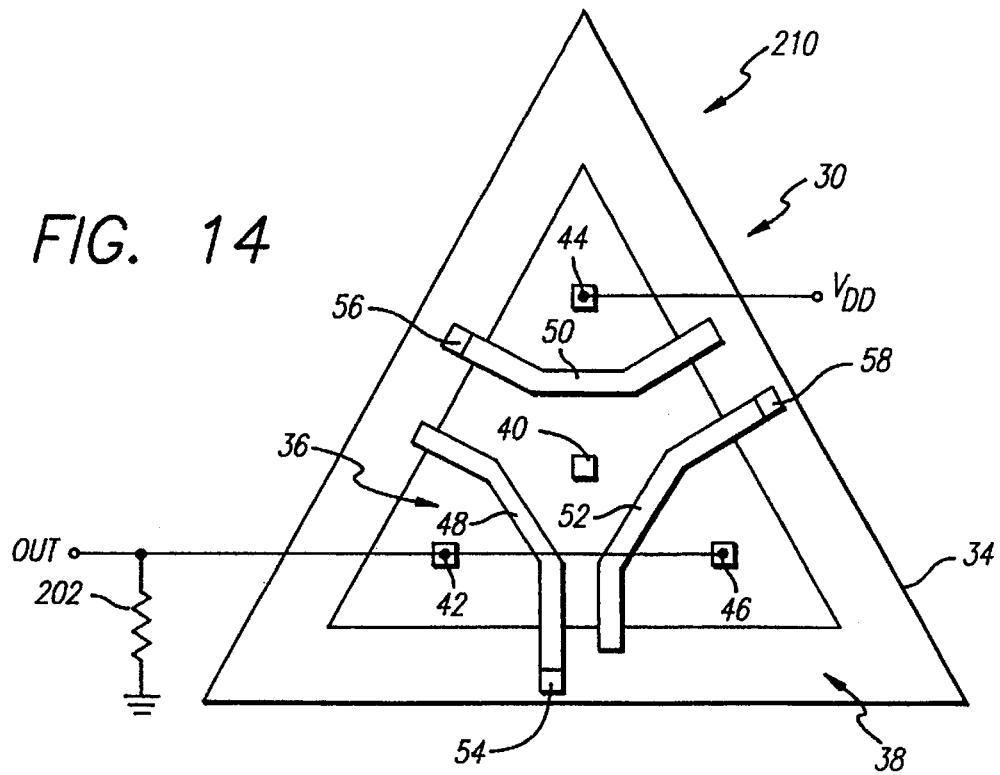
FIG. 14 is a diagram illustrating a modification of the arrangement illustrated in FIG. 11.

It is further within the scope of the invention to connect two terminals to the output as illustrated in FIG. 14. In a gate 210, the first terminal 42 and the third terminal 46 are connected to the output, whereas the second terminal 44 is connected to $V_{DD}$.

The gate 210 provides the logical function B(A+C), because the second gate 50 can block current flow from $V_{DD}$ to the output, whereas either of the gates 48 and 52 can establish a conductive path between the second gate 50 and the output.

Space in the present triangular OR gate device is used most efficiently in the illustrated configuration, in which the terminals are disposed adjacent to the apices of the triangle and the gate terminals are disposed adjacent to the edges of the triangle.

However, the present invention is not so limited, and it is possible to locate the terminals adjacent to the edges, and locate the gate terminals adjacent to the apices of the triangle. Other arrangements of the terminals, although not explicitly illustrated, are possible within the scope of the invention.

We claim:

1. A microelectronic device formed on a semiconductor substrate, the device having a periphery defined by a triangle and comprising:

an active area formed within said periphery;

a central terminal formed in a central portion of said active area;

a first terminal which is formed in said active area and spaced from the central terminal; and a first gate formed between the first terminal and the central terminal.

2. A device as in claim 1, further comprising an inactive area disposed between said active area and said periphery.

3. A device as in claim 2, further comprising a first gate terminal which is formed in said inactive area and connected to the first gate.

4. A device as in claim 1, in which:

the central terminal constitutes a source terminal; and the first terminal constitutes a drain terminal.

5. A device as in claim 1, in which:

the central terminal constitutes a drain terminal; and the first terminal constitutes a source terminal.

6. A device as in claim 1, in which:

said triangle has first, second and third vertices;

the first terminal is formed adjacent to said first vertex; and the device further comprises:

a second terminal formed adjacent to said second vertex in said active area; and a second gate formed between the second terminal and the central terminal.

7. A device as in claim 6, further comprising:

a third terminal formed adjacent to said third vertex in said active area; and a third gate formed between the third terminal and the central terminal.

8. A device as in claim 1, further comprising:

a second terminal which is formed in said active area and spaced from the central terminal and the first terminal; and a second gate formed between the second terminal and the central terminal.

9. A device as in claim 8, further comprising a pull-down resistor, in which:

said active area is N-type;

the central terminal constitutes a source terminal and is connected to a first potential through the pull-down resistor;

the first and second terminals constitute drain terminals and are connected to a second potential which is more positive than said first potential; and the device provides an OR function with inputs applied to the first and second gates and an output taken from the central terminal.

10. A device as in claim 8, further comprising a pull-up resistor, in which:

said active area is N-type;

the central terminal constitutes a source terminal and is connected to a first potential;

the first and second terminals constitute drain terminals and are connected to a second potential which is more positive than said first potential through the pull-up resistor; and the device provides an NOR function with inputs applied to the first and second gates and an output taken from the first and second terminals.

11. A device as in claim 8, further comprising a pull-up resistor, in which:

said active area is P-type;

the central terminal constitutes a source terminal and is connected to a first potential through the pull-up resistor;

the first and second terminals constitute drain terminals and are connected to a second potential which is more negative than said first potential; and the device provides an AND function with inputs applied to the first and second gates and an output taken from the central terminal.

12. A device as in claim 8, further comprising a pull-down resistor, in which:

said active area is P-type;

the central terminal constitutes a source terminal and is connected to a first potential;

the first and second terminals constitute drain terminals and are connected to a second potential which is more negative than said first potential through the pull-down resistor; and the device provides a NAND function with inputs applied to the first and second gates and an output taken from the first and second terminals.

13. A device as in claim 1, in which:

the device is a Metal-Oxide-Semiconductor (MOS) device; and the first gate comprises:

an insulating oxide layer formed over the substrate; and a conductive metal layer formed over the oxide layer.

14. A device as in claim 1, further comprising an inactive area disposed between said active area and said periphery, in which the first gate has opposite end portions that extend into said inactive area.

15. A device as in claim 1, further comprising an inactive area disposed between said active area and said periphery, in which:

said triangle has first, second and third edges and first, second and third vertices;

the first terminal is formed adjacent to said first vertex; and the device further comprises:
- a first gate terminal which is formed in said inactive area adjacent to said first edge and is connected to the first gate;
- a second terminal formed adjacent to said second vertex in said active area;
- a second gate formed between the second terminal and the central terminal;
- a second gate terminal which is formed in said inactive area adjacent to said second edge and is connected to the second gate;
- a third terminal formed adjacent to said third vertex in said active area;
- a third gate formed between the third terminal and the central terminal; and
- a third gate terminal which is formed in said inactive area adjacent to said third edge and is connected to the third gate.

16. A microelectronic device formed on a semiconductor substrate, the device having a periphery defined by a triangle and comprising:
- an active area formed within said periphery;
- first, second and third terminals formed in said active area in spaced relation to each other;
- a first gate formed between the first terminal, and the second and third terminals;
- a second gate formed between the first terminal and the second terminal; and
- a third gate formed between the first terminal and the third terminal.

17. A device as in claim 16, further comprising an inactive area disposed between said active area and said periphery.

18. A device as in claim 17, further comprising first, second and third gate terminals which are formed in said inactive area and are connected to the first, second and third gates respectively.

19. A device as in claim 16, in which:
the first terminal constitutes a source terminal; and
the second and third terminals constitute drain terminals.

20. A device as in claim 16, in which:
the first terminal constitutes a drain terminal; and
the second and third terminals constitute source terminals.

21. A device as in claim 16, in which:
the first terminal constitutes an output terminal; and
the second and third terminals are connected to a predetermined potential.

22. A device as in claim 16, in which:
the second and third terminals are interconnected and constitute output terminals; and
the first terminal is connected to a predetermined potential.

23. A device as in claim 16, in which:
said triangle comprises first, second and third vertices; and
the first, second and third terminals are formed adjacent to said first, second and third vertices respectively.

24. A microelectronic integrated circuit, comprising:
a semiconductor substrate; and
a plurality of microelectronic devices formed on the substrate, each device having a periphery defined by a triangle and comprising:
an active area formed within said periphery;
a central terminal formed in a central portion of said active area;
a first terminal which is formed in said active area and spaced from the central terminal; and
a first gate formed between the first terminal and the central terminal.

25. An integrated circuit as in claim 24, in which at least one of said devices further comprises an inactive area disposed between said active area and said periphery.

26. An integrated circuit as in claim 25, in which at least one of said devices further comprises a first gate terminal which is formed in said inactive area and connected to the first gate.

27. An integrated circuit as in claim 24, in which:
the central terminal constitutes a source terminal; and
the first terminal constitutes a drain terminal.

28. An integrated circuit as in claim 24, in which:
the central terminal constitutes a drain terminal; and
the first terminal constitutes a source terminal.

29. An integrated circuit as in claim 24, in which:
said triangle has first, second and third vertices;
the first terminal is formed adjacent to said first vertex; and
at least one of said devices further comprises:
- a second terminal formed adjacent to said second vertex in said active area; and
- a second gate formed between the second terminal and the central terminal.

30. An integrated circuit as in claim 29, in which at least one of said devices further comprises:
- a third terminal formed adjacent to said third vertex in said active area; and
- a third gate formed between the third terminal and the central terminal.

31. An integrated circuit as in claim 24, in which at least one of said devices further comprises:
- a second terminal which is formed in said active area and spaced from the central terminal and the first terminal; and
- a second gate formed between the second terminal and the central terminal.

32. An integrated circuit as in claim 31, in which at least one of said devices further comprises a pull-down resistor, in which:
said active area is N-type;
the central terminal constitutes a source terminal and is connected to a first potential through the pull-down resistor;
the first and second terminals constitute drain terminals and are connected to a second potential which is more positive than said first potential; and
the device provides an OR function with inputs applied to the first and second gates and an output taken from the central terminal.

33. An integrated circuit as in claim 31, in which at least one of said devices further comprises a pull-up resistor, in which:
said active area is N-type;
the central terminal constitutes a source terminal and is connected to a first potential;
the first and second terminals constitute drain terminals and are connected to a second potential which is more positive than said first potential through the pull-up resistor; and the device provides an NOR function with inputs applied to the first and second gates and an output taken from the first and second terminals.

34. An integrated circuit as in claim 31, in which at least one of said devices further comprises a pull-up resistor, in which:

said active area is P-type;

the central terminal constitutes a source terminal and is connected to a first potential through the pull-up resistor;

the first and second terminals constitute drain terminals and are connected to a second potential which is more negative than said first potential; and the device provides an AND function with inputs applied to the first and second gates and an output taken from the central terminal.

35. An integrated circuit as in claim 31, in which at least one of said devices further comprises a pull-down resistor, in which:

said active area is P-type;

the central terminal constitutes a source terminal and is connected to a first potential;

the first and second terminals constitute drain terminals and are connected to a second potential which is more negative than said first potential through the pull-down resistor; and the device provides a NAND function with inputs applied to the first and second gates and an output taken from the first and second terminals.

36. An integrated circuit as in claim 24, in which:

at least one of said devices is a Metal-Oxide-Semiconductor (MOS) device; and the first gate comprises:

an insulating oxide layer formed over the substrate; and
a conductive metal layer formed over the oxide layer.

37. An integrated circuit as in claim 24, in which at least one of said devices further comprises an inactive area disposed between said active area and said periphery, in which the first gate has opposite end portions that extend into said inactive area.

38. An integrated circuit as in claim 24, in which:

said devices are closely packed on the substrate; and the circuit further comprises interconnect wiring for electrically interconnecting the central terminals, first terminals and gates of said devices in a predetermined manner, the wiring comprising electrical conductors that extend in three directions that are angularly displaced from each other by 60°.

39. An integrated circuit as in claim 38, in which at least one of said devices further comprises:

an inactive area disposed between said active area and said periphery, said triangle having first, second and third edges and first, second and third vertices, the first terminal being formed adjacent to said first vertex;

a first gate terminal which is formed in said inactive area adjacent to said first edge and is connected to the first gate;

a second terminal formed adjacent to said second vertex in said active area;

a second gate formed between the second terminal and the central terminal;

a second gate terminal which is formed in said inactive area adjacent to said second edge and is connected to the second gate;

a third terminal formed adjacent to said third vertex in said active area;

a third gate formed between the third terminal and the central terminal; and a third gate terminal which is formed in said inactive area adjacent to said third edge and is connected to the third gate;

said interconnect wiring further comprising electrical conductors for interconnecting the central terminals, first terminals, second terminals, third terminals, first gates, second gates and third gates of said devices in said predetermined manner.

* * * * *